United States Patent
Bandyopadhyay et al.

(10) Patent No.: US 11,621,722 B2
(45) Date of Patent: Apr. 4, 2023

(54) MULTI QUANTIZER LOOPS FOR DELTA-SIGMA CONVERTERS

(71) Applicant: Analog Devices, Inc., Wilmington, MA (US)

(72) Inventors: Abhishek Bandyopadhyay, Winchester, MA (US); Akira Shikata, Chelsea, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/459,020

(22) Filed: Aug. 27, 2021

(65) Prior Publication Data

US 2023/0065453 A1 Mar. 2, 2023

(51) Int. Cl.
*H03M 3/00* (2006.01)
(52) U.S. Cl.
CPC .................. *H03M 3/352* (2013.01)
(58) Field of Classification Search
CPC .................................................. H03M 3/352
See application file for complete search history.

(56) References Cited

U.S. PATENT DOCUMENTS

| | | | |
|---|---|---|---|
| 5,153,593 A | 10/1992 | Walden et al. | |
| 5,648,779 A * | 7/1997 | Cabler | H03M 3/418 341/118 |
| 6,255,975 B1 | 7/2001 | Swanson | |
| 6,313,774 B1 * | 11/2001 | Zarubinsky | H03M 3/412 341/143 |
| 6,373,417 B1 | 4/2002 | Melanson | |
| 6,556,158 B2 | 4/2003 | Steensgaard-madsen | |
| 6,744,392 B2 | 6/2004 | Melanson | |
| 6,864,818 B1 * | 3/2005 | Hezar | H03M 3/396 341/143 |

(Continued)

FOREIGN PATENT DOCUMENTS

EP 3413468 A1 12/2018

OTHER PUBLICATIONS

Bandyopadhyay, Abhishek, et al., "A 97.3 dB SNR, 600 kHz BW, 31 mW Multibit Continuous Time ?S ADC", IEEE Symposium on VSLI Circuits Digest of Technical Papers, (2014), 2 pgs.

(Continued)

*Primary Examiner* — Lam T Mai
(74) *Attorney, Agent, or Firm* — Schwegman Lundberg & Woessner, P.A.

(57) ABSTRACT

The number of bits in the quantizer can be decoupled from the number of bits in the feedback digital-to-analog converter (DAC) A delta-sigma analog-to-digital converter circuit can include a first quantizer to generate an output having a first number of bits and a second quantizer coupled to an output of the first quantizer, where the second quantizer can receive the output of the first quantizer and generate an output having a second number of bits. The feedback DAC can be coupled to the second quantizer to receive a representation of the output of the second quantizer, where the output of the feedback digital-to-analog converter circuit has the second number of bits. These techniques can reduce the area of the feedback DAC, e.g., 4 or 5 bits, and the techniques can achieve a higher maximum stable amplitude (MSA) because it is effectively a second order loop.

20 Claims, 5 Drawing Sheets

(56) References Cited

U.S. PATENT DOCUMENTS

| | | | |
|---|---|---|---|
| 6,920,182 B2 | 7/2005 | Bolton, Jr. | |
| 7,450,047 B1 | 11/2008 | Wu | |
| 7,889,108 B2 | 2/2011 | Hamashita et al. | |
| 8,031,096 B2 | 10/2011 | Kinyua | |
| 8,988,260 B2 | 3/2015 | Kinyua | |
| 9,118,341 B2 | 8/2015 | Matsumoto et al. | |
| 9,136,867 B2 | 9/2015 | Watanabe | |
| 9,397,692 B1 * | 7/2016 | Zanbaghi | H03M 3/438 |
| 9,419,642 B1 | 8/2016 | Nguyen | |
| 9,455,737 B1 * | 9/2016 | Rajaee | H03M 3/464 |
| 9,621,175 B2 | 4/2017 | Pagnanelli | |
| 9,871,534 B2 | 1/2018 | Tsai et al. | |
| 10,879,924 B2 * | 12/2020 | Zhou | H03M 3/422 |
| 2010/0219998 A1 | 9/2010 | Oliaei | |
| 2016/0065232 A1 | 3/2016 | Dagher et al. | |
| 2017/0288693 A1 * | 10/2017 | Kumar | H03M 3/468 |

OTHER PUBLICATIONS

Liu, Qiyuan, et al., "A Continuous-Time MASH 1-1-1 Delta-Sigma Modulator With FIR DAC and Encoder-Embedded Loop-Unrolling Quantizer in 40-nm CMOS", IEEE Transactions on Very Large Scale Integration (VLSI) Systems, 12 pgs.

"U.S. Appl. No. 17/459,071, Non Final Office Action dated Aug. 16, 2022", 12 pgs.

"U.S. Appl. No. 17/459,071, Response filed Nov. 9, 2022 to Non Final Office Action dated Aug. 16, 2022", 12 pgs.

* cited by examiner

MULTI QUANTIZER LOOPS FOR DELTA-SIGMA CONVERTERS

FIELD OF THE DISCLOSURE

This document pertains generally, but not by way of limitation, to digital-to-analog conversion, and more particularly to delta-sigma converter circuits.

BACKGROUND

In many electronics applications, an analog input signal is converted to a digital output signal (e.g., for further digital signal processing). For instance, in precision measurement systems, electronics are provided with one or more sensors to make measurements and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

This disclosure is directed to, among other things, techniques to decouple the number of bits in a quantizer from the number of bits in the feedback digital-to-analog converter (DAC). A delta-sigma analog-to-digital converter circuit can include a first quantizer to generate an output having a first number of bits and a second quantizer coupled to an output of the first quantizer, where the second quantizer can receive the output of the first quantizer and generate an output having a second number of bits. The feedback DAC can be coupled to the second quantizer to receive a representation of the output of the second quantizer, where the output of the feedback digital-to-analog converter circuit has the second number of bits. These techniques can reduce the area of the feedback DAC, e.g., 4 or 5 bits, and the techniques can achieve a higher maximum stable amplitude (MSA) because it is effectively a second order loop.

In some aspects, this disclosure is directed to a delta-sigma analog-to-digital converter circuit to receive an analog input signal at an input and generate a digital output signal, the delta-sigma analog-to-digital converter circuit comprising: an input summing node configured to receive and combine the analog input signal and an output of a digital-to-analog converter circuit; a first quantizer to receive a representation of the combined analog input signal and output of the digital-to-analog converter circuit, the first quantizer to generate an output having a first number of bits; a second quantizer coupled to an output of the first quantizer to receive the output of the first quantizer, the second quantizer to generate an output having a second number of bits; and the digital-to-analog converter circuit coupled to the second quantizer to receive a representation of the output of the second quantizer, wherein the output of the digital-to-analog converter circuit has the second number of bits.

In some aspects, this disclosure is directed to a method of operating a delta-sigma analog-to-digital converter circuit to receive an analog input signal at an input and generate a digital output signal, the method comprising: receiving and combining, using an input summing node, the analog input signal and an output of a digital-to-analog converter circuit; receiving, using a first quantizer, a representation of the combined analog input signal and output of the digital-to-analog converter circuit and generating an output having a first number of bits; receiving, using a second quantizer coupled to an output of the first quantizer, the output of the first quantizer and generating an output having a second number of bits; and receiving, using the digital-to-analog converter circuit coupled to the second quantizer, a representation of the output of the second quantizer, wherein the output of the digital-to-analog converter circuit has the second number of bits.

In some aspects, this disclosure is directed to a delta-sigma analog-to-digital converter circuit to receive an analog input signal at an input and generate a digital output signal, the delta-sigma analog-to-digital converter circuit comprising: an input summing node configured to receive and combine the analog input signal and an output of a digital-to-analog converter circuit; a successive approximation register analog-to-digital converter to receive a representation of the combined analog input signal and output of the digital-to-analog converter circuit, the successive approximation register analog-to-digital converter to generate an output having a first number of bits; a digital quantizer coupled to an output of the successive approximation register analog-to-digital converter to receive the output of the successive approximation register analog-to-digital converter, the digital quantizer to generate an output having a second number of bits; and the digital-to-analog converter circuit coupled to the digital quantizer to receive a representation of the output of the digital quantizer, wherein the output of the digital-to-analog converter circuit has the second number of bits.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
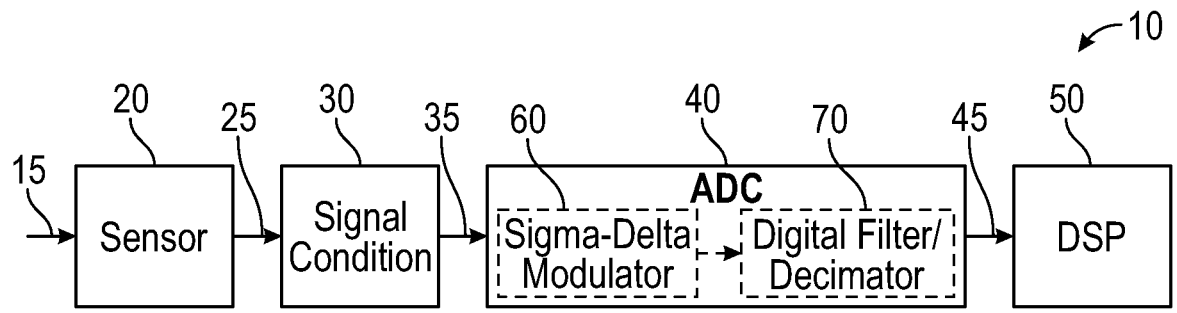
FIG. 1 is a schematic block diagram of an example of a data acquisition system 10, which can implement a delta-sigma modulator.

In existing delta-sigma analog-to-digital converter (ADC) approaches, the number of bits in the quantizer typically dictates the number of bits in the feedback digital-to-analog converter (DAC). The size of the feedback digital-to-analog converter can become a limiting factor, however. For example, using more than six bits in the quantizer can make the feedback DAC prohibitively large, or even require multiple feedback DACs, such as due to the thermometer coding used by the feedback DAC.

Some delta-sigma ADC approaches use splitter techniques or segmentation techniques to reduce the effective number of bits in the feedback DAC. Segmentation techniques can cause errors, however, such as gain mismatch. For example, errors between the most significant bits (MSBs) and the least significant bits (LSBs) can be problematic.

Some delta-sigma ADC approaches use a finite impulse response (FIR) DAC technique. In such an approach, a 1-bit quantizer can be used with a multi-bit feedback DAC, where FIR filtering can be used to convert a single bit to multiple bits that can be received by the feedback DAC.

In existing approaches, the number of bits in the quantizer dictates both the in-band noise and the out-of-band noise. There is no independent control of the in-band noise and the out-of-band noise; one can be improved but at the expense of the other.

There are several techniques that can be used to improve the signal to quantization noise ratio (SQNR) in delta-sigma ADCs. Some delta-sigma ADC approaches use a higher oversampling rate (OSR), such as 128 or 256 for audio applications. However, the higher OSR can affect amplifier bandwidths and increase power consumption, although passive area can be reduced.

In another delta-sigma ADC approach, higher order architectures, such as third order or higher, can be used. However, the maximum stable amplitude (MSA) can be reduced and there can be instability issues. In addition, the area is larger-even with single operational amplifier resonator circuits because the passive driven area increases.

In another delta-sigma ADC approach, the infinity value can be increased, which is a proxy for more out-of-band noise. However, a higher H infinity value is typically not a good way to achieve a desirable SQNR; as H infinity is increased, the more impact it can have on stability and jitter, for example.

Using various techniques of this disclosure, the number of bits in the quantizer can be decoupled from the number of bits in the feedback DAC. As described in detail below, a delta-sigma analog-to-digital converter circuit can include a first quantizer to generate an output having a first number of bits and a second quantizer coupled to an output of the first quantizer, where the second quantizer can receive the output of the first quantizer and generate an output having a second number of bits. A feedback digital-to-analog, converter circuit can be coupled to the second quantizer to receive a representation of the output of the second quantizer, where the output of the feedback digital-to-analog converter circuit has the second number of bits. These techniques can allow the first quantizer to generate an output having a large number of bits and can keep the loop order and the OSR low, e.g., second order and 64×OSR for audio applications. In addition, the area of the feedback digital-to-analog converter circuit can be reduced, e.g., 4 or 5 bits, and the techniques can achieve a higher maximum stable amplitude (MSA) because it is effectively a second order loop.

FIG. 1 is a schematic block diagram of an example of a data acquisition system 10, which can implement a delta-sigma modulator. The data acquisition system 10 can be an electronic device (including an electronic circuit and/or one or more components) configured to convert signals (such as analog signals) into a usable form. In various implementations, the data acquisition system 10 can convert physical conditions into digital form, which can be stored and/or analyzed. FIG. 1 has been simplified for the sake of clarity. Additional features can be added in the data acquisition system 10, and some of the features described can be replaced or eliminated in other embodiments of the data acquisition system 10.

In FIG. 1 the data acquisition system 10 can include an input signal 15 that represents a physical condition, such as temperature, pressure, sound, velocity, flow rate, position, other physical condition, or combination thereof. A sensor circuit block 20 can receive an input signal 15 and convert the physical condition (represented by input signal 15) into an electrical signal, such as an analog signal 25. The analog signal 25 can be a voltage or current that represents the physical condition (represented by the input signal 15).

A signal conditioning circuit block 30 can receive and adjust the analog signal 25 within an acceptable range of an analog-to-digital converter (ADC), providing a conditioned analog signal 35. The conditioned analog signal 35 can be provided at ADC circuit block 40, such that the signal conditioning circuit block 30 can act as an interface between the sensor circuit block 20 and the ADC circuit block 40, the conditioning analog signal 25 (and thus providing the conditioned analog signal 35) before the ADC circuit block 40 digitizes the analog signal. The signal conditioning circuit block 30 can amplify, attenuate, filter, and/or perform other conditioning functions to the analog signal 25. The ADC circuit block 40 can receive and convert the conditioned analog signal 35 into digital form, providing a digital signal 45. The digital signal 45 can represent the physical quantity received by the sensor via the input signal 15. A digital signal processor (DSP) circuit block 50 can receive and process digital signal 45.

The ADC circuit block 40 can include a delta-sigma ADC that generates a digital signal using a feedback technique, where the delta-sigma ADC can oversample its input signal (here, the conditioned analog signal 35) and perform noise-shaping to achieve a high-resolution digital signal (here, the digital signal 45). The delta-sigma ADC can include a delta-sigma modulator 60 and a digital filter/decimator 70. The delta-sigma modulator 60 can use oversampling (for example, a sampling rate above Nyquist rate) and filtering to generate a digital signal that represents the input signal received by the delta-sigma ADC (such as the conditioned analog signal 35).

In various implementations, the delta-sigma ADC feedback loop forces the output of the modulator to be a good representation of the input signal in the bandwidth of interest. The digital filter/decimator 70 can attenuate noise and/or slow a data rate (for example, to a Nyquist sampling rate) of the digital signal, providing the digital signal 45. The digital filter/decimator 70 can include a digital filter, a decimator, or both. The digital filter can attenuate the digital signal received from the delta-sigma modulator 60, and the decimator can reduce a sampling rate of the digital signal received from the delta-sigma modulator 60.

Figure 2:
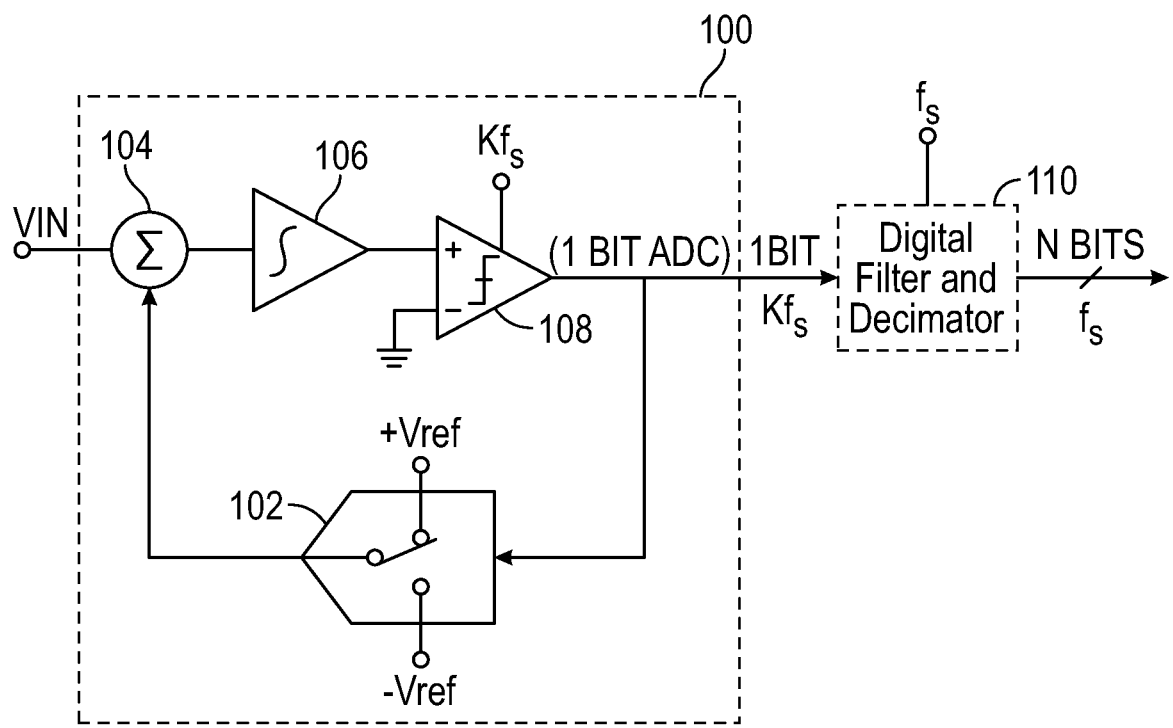
FIG. 2 is a block diagram of an example of a first-order single-bit delta-sigma ADC.

FIG. 2 is a block diagram of an example of a first-order single-bit delta-sigma ADC. The delta-sigma modulator 100 can be an example of the delta-sigma modulator 60 of FIG. 1. The delta-sigma modulator 100 can convert an input signal (Vin) into a continuous serial stream of ones and zeros at a rate determined by a sampling clock frequency Kfs. A one-bit digital-to-analog converter (DAC) 102 can be driven by the serial output data stream to generate a feedback signal. The output of the digital-to-analog converter (DAC) 102 can be subtracted from the input signal using a summing element 104. The summing element 104 can be implemented as the summing node of an operational amplifier (op amp), such as the op amp of an integrator 106.

The integrator 106 can integrate the output of summing element 104, and the output of the integrator 106 can be applied to a clocked latched comparator 108. For an input signal of zero, the comparator output can include an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output can be applied to a digital filter and decimator 110 that averages every M cycles, where M is a positive integer greater than 1. The digital filter and decimator 110 can be an example of the digital filter/decimator 70 of FIG. 1. The decimator reduces the effective sampling rate at the output to fs.

Figure 3:
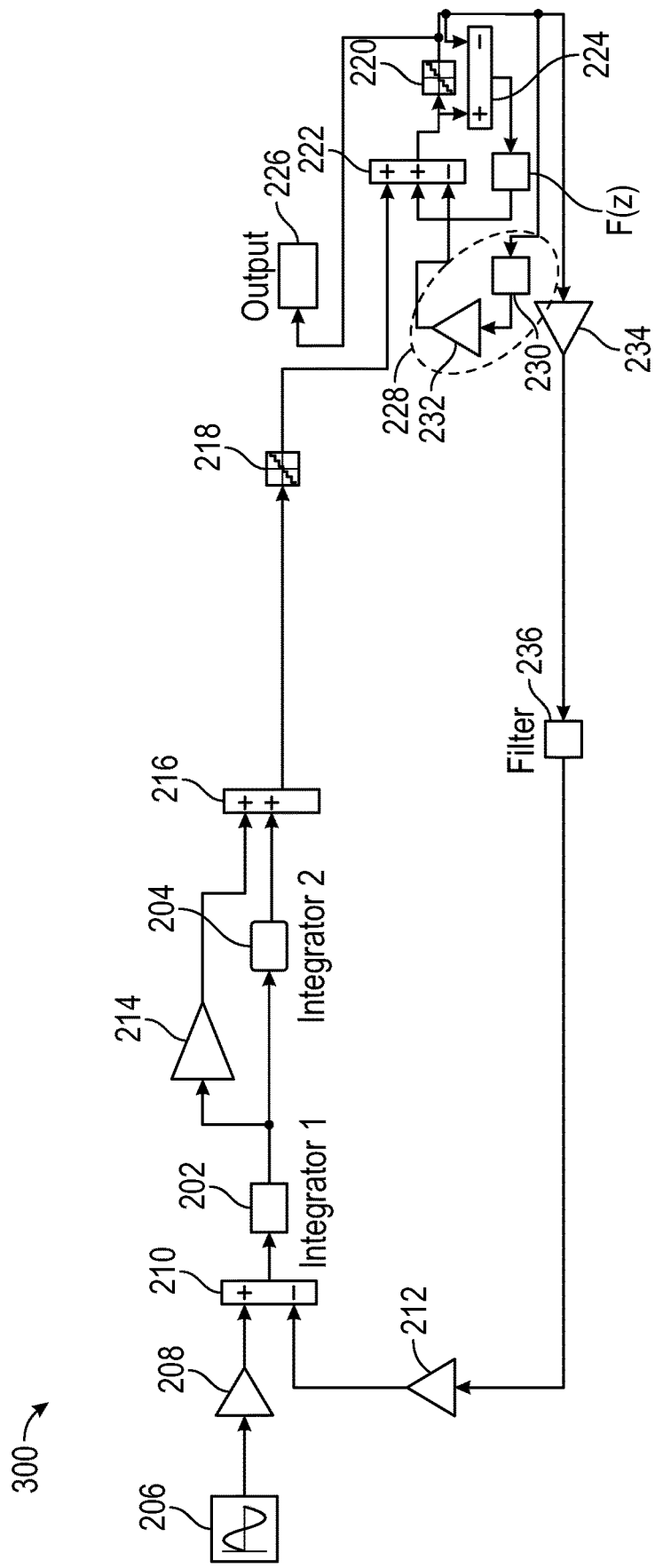
FIG. 3 is a block diagram of an example of a delta-sigma ADC circuit that can implement various techniques of this disclosure.

FIG. 3 is a block diagram of an example of a delta-sigma ADC circuit that can implement various techniques of this disclosure. In the example shown, the circuit 200 can be a second order feed-forward loop having a first integrator 202 and a second integrator 204. The first integrator 202 and the second integrator 204 can be continuous time integrators or discrete time integrators, e.g., switched capacitor-based integrators. The circuit 200 can receive an analog input signal 206 at an input 208, e.g., a buffer. An input summing node 210 can receive and combine the analog input signal 206 and an output of a feedback digital-to-analog converter circuit 212.

The first integrator 202 can receive the output of the input summing node 210 and perform an integration. The output of the first integrator 202 can be applied to a gain block 214, and the output of the gain block 214 can be combined with the output of the second integrator 204 by a summing node 216. The first integrator 202 and the second integrator 204 form a second order loop filter. In other examples, there can be one integrator, e.g., a first order loop filter, or more than two integrators. As such, the loop filter can be any order loop filter.

As mentioned above, the circuit 200 can include a first quantizer 218 and a second quantizer 220, The first quantizer 218 can receive the output of the summing node 216, which can be a representation of the combined analog input signal 206 and output of the digital-to-analog converter circuit 212. The first quantizer 218 can generate an output having a first number of bits. As a non-limiting example, the first quantizer 218 can generate an output having 8-10 bits.

The first quantizer 218 can dictate the in-band signal-to-quantization noise ratio (SQNR) of the circuit 200. In some examples, the first quantizer 218 can be a flash ADC. In some examples, the first quantizer 218 can be a successive approximation register (SAR) ADC circuit, such as an asynchronous SAR ADC or a synchronous SAR ADC.

In accordance with this disclosure, the circuit 200 can further include a second quantizer 220 coupled to an output of the first quantizer 218 to receive the output of the first quantizer 218. The second quantizer 220 can generate an output having a second number of bits. In some examples, the second number of bits is less than the first number of bits. As a non-limiting example, the second quantizer 220 can generate an output having 4 or 5 bits.

In some examples, the second number of bits of the second quantizer 220 can be less than the first number of bits of the first quantizer 218. In some examples, the second quantizer 220 can be implemented using digital techniques, such as a processor circuit, such as a digital signal processor circuit.

In the example shown, an output of the first quantizer 218 can be fed to a second quantizer summing node 222. The second quantizer 220 can receive an output of the second quantizer summing node 222, which can also be applied to a summing node 224. The output of the second quantizer 220 can be applied to the summing node 224 and subtracted from the output of the second quantizer summing node 222, In addition, the output of the second quantizer 220 can be applied to an output node 226 of the circuit 200 to provide a digital output of the delta-sigma ADC.

An output of the summing node 224 can be applied to a filter F(z), e.g., a finite impulse response (FIR) filter, which can then be fed to the second quantizer summing node 222 during the next clock cycle. The filter F(z) can receive a difference between an input of the second quantizer 220 and the output of the second quantizer 220. The filter F(z) can be a first order filter or a higher order filter. In some examples, the filter F(z) can be a delay such as $z^{-1}$. The output of the filter F(z) can be combined with the output of the first quantizer by the second quantizer summing node 222.

In configurations in which the first quantizer 218 is a SAR ADC, an excess loop delay compensation circuit 228 can be included. The excess loop delay compensation circuit 228 can include a filter 230, e.g., a delay such as $z^{-1}$, and a gain block 232, for example. The output of the excess loop delay compensation circuit 228 can be fed to the second quantizer summing node 222 and subtracted from the other two inputs to the second quantizer summing node 222. The excess loop delay compensation circuit 228 can receive an output of the second quantizer 220 and compensate for a delay introduced by the first quantizer 218. The second quantizer summing node 222 can receive an output of the excess loop delay compensation circuit 228, an output of the filter F(z), and the output of the first quantizer 218.

This technique of using a second quantizer 220 can re-quantize the output of the first quantizer 218 in order to reduce the number of bits applied to the feedback digital-to-analog converter circuit 212. In this manner, the circuit 200 can include a multi-quantizer loop (MQL). Although two quantizers are shown, more than two quantizers can be used. In such a configuration, the number of bits can be reduced in stages, such as from 8 bits to 5 bits to 3 bits by using three quantizers in a non-limiting example.

The output of the second quantizer 220 can be fed to a buffer 234 and the output of the buffer can be fed to a filter 236, e.g., a delay such as $z^1$, such as in configurations in which the first quantizer 218 is a SAP ADC. For example, the filter 236 can provide one clock delay to emulate the delay of a SAR ADC or for dynamic element matching. The filter 236 can be coupled to an input of the feedback digital-to-analog converter circuit 212. As a non-limiting example, the first quantizer 218 can generate an output having 8-10 bits and the feedback digital-to-analog converter circuit 212 can generate an output having 4 or 5 bits. In this manner, the feedback digital-to-analog converter circuit 212 can be coupled to the second quantizer 220 to receive a representation of the output of the second quantizer 220, where the output of the feedback digital-to-analog converter circuit 212 has the second number of bits.

By using both the first quantizer 218 and the second quantizer 220, the circuit 200 can decouple the in-band SQNR and out-of-band energy, in contrast to existing approaches. In addition, the number of bits in the first quantizer 218 can be decoupled from the number of bits in the feedback digital-to-analog converter circuit 212. This can allow the feedback digital-to-analog converter circuit 212 to be much smaller than in existing approaches. For example, the feedback digital-to-analog converter circuit 212 can fewer elements. As an example, a thermometer encoded digital-to-analog converter circuit can have $2^N$ elements. A reduction in the number N from 8 bits to 5 bits can reduce the number of elements needed in the feedback digital-to-analog converter circuit 212 from 256 to 32.

Figure 4:
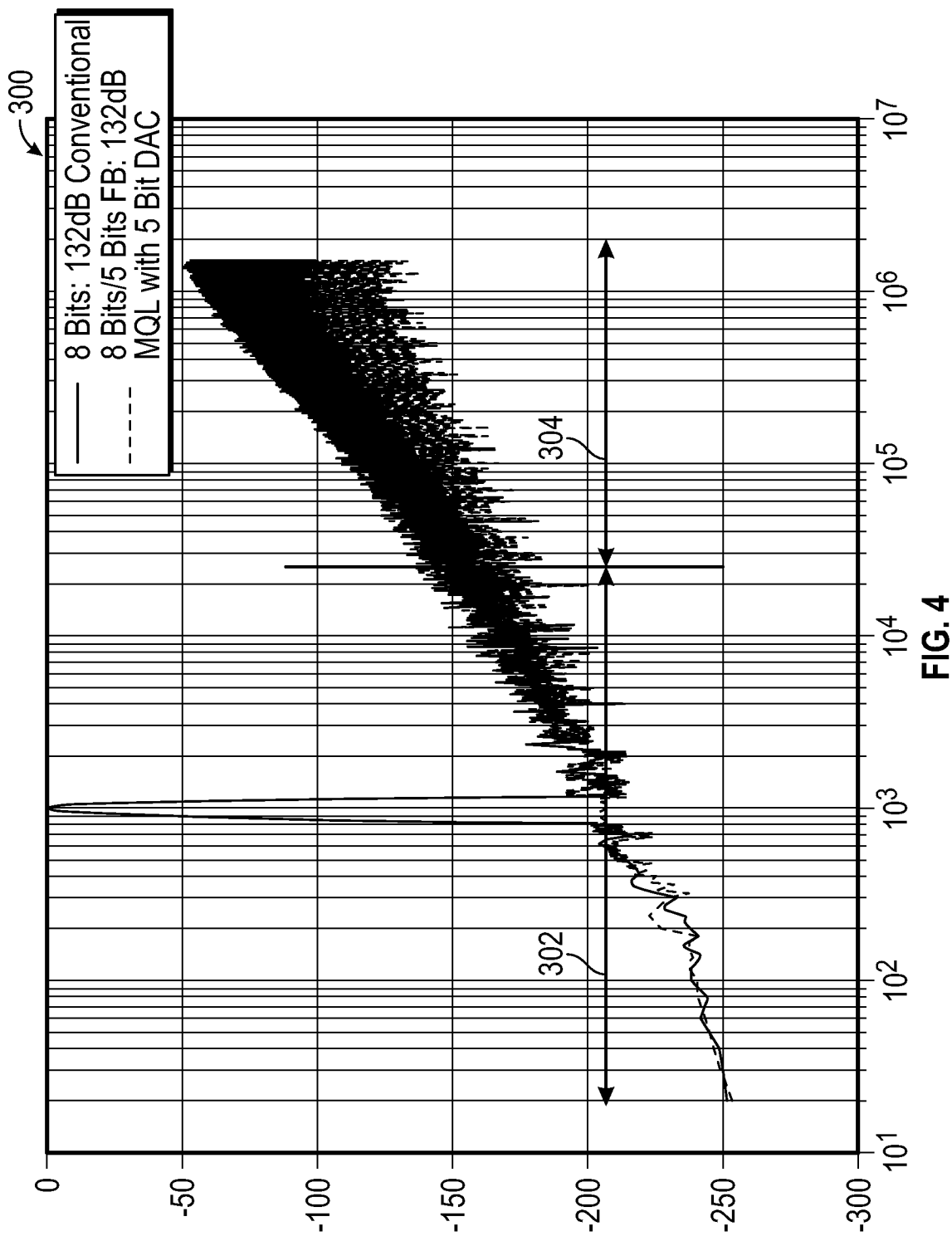
FIG. 4 is a graph of an example of a simulation comparing output spectrums.

FIG. 4 is a graph of an example of a simulation comparing output spectrums. The x-axis represents frequency, and the y-axis represents spectrum in decibels (dB). The graph 300 compares a conventional 8-bit delta-sigma ADC generating an in-band SQNR of 132 dB and a delta-sigma ADC using the techniques of this disclosure in FIG. 3 that includes an 8-bit first quantizer and a 5-bit feedback digital-to-analog converter circuit generating an in-band SQNR of 132 dB. Each ADC circuit was a second order with an OSR of 64×. The band-of-interest is shown at 302 (in-band), and the out-of-band is shown at 304.

The delta-sigma ADC techniques in FIG. 3 perform like the conventional delta-sigma ADC in-band, as indicated by their similar SQNRs. That is, the in-band noise of the delta-sigma ADC techniques of FIG. 3 is approximately the same as the in-band noise of a conventional delta-sigma ADC with a quantizer and a feedback DAC as high resolution as the first quantizer. The first quantizer, e.g., the first quantizer 218 of FIG. 3, dictates the in-band noise. The second quantizer, e.g., the second quantizer 220 of FIG. 3, dictates the out-of-band noise.

Figure 5:
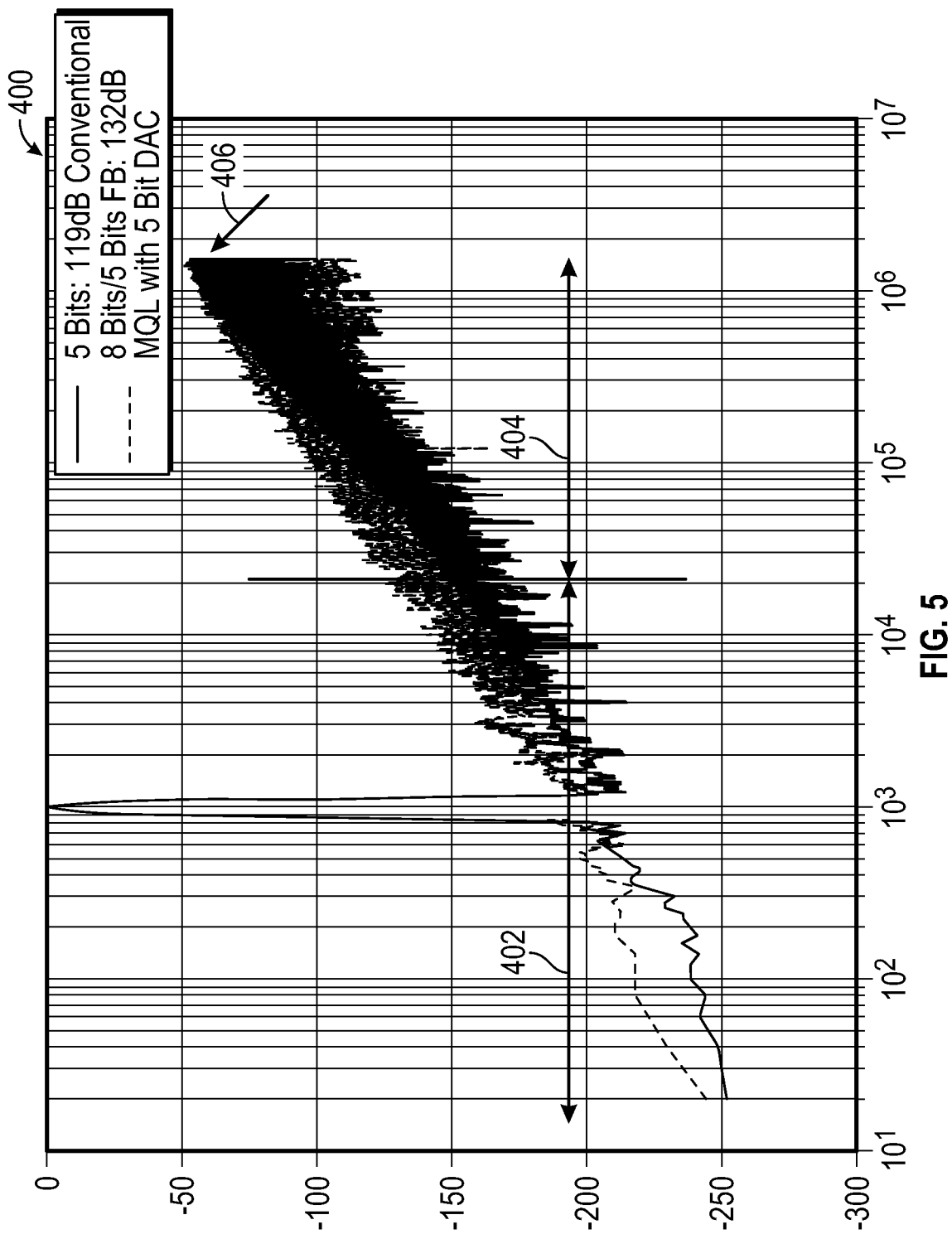
FIG. 5 is a graph of another example of a simulation comparing output spectrums.

FIG. 5 is a graph of another example of a simulation comparing output spectrums. The x-axis represents frequency, and the y-axis represents spectrum in decibels (dB). The graph 400 compares a conventional 5-bit delta-sigma ADC generating an in-band SQNR of 119$d$B and a delta-sigma ADC using the techniques of this disclosure in FIG. 3 that includes an 8-bit first quantizer and a 5-bit feedback digital-to-analog converter circuit generating an in-band SQNR of 132 dB. Each ADC circuit was a second order with an OSR of 64×. The band-of-interest is shown at 402 (in-band), and the out-of-band is shown at 404.

As shown in FIG. 5, the in-band noise of the conventional delta-sigma ADC circuit is much higher than that of the delta-sigma ADC that uses the techniques of FIG. 3. The out-of-band noise for the delta-sigma ABC that uses the techniques of FIG. 3 is similar to the out-of-band noise of the conventional delta-sigma ADC circuit, as shown at 406. FIGS. 4 and 5 graphically illustrate how the techniques of this disclosure can provide independent control over in-band and out-of-band noise. In an extreme example, the first quantizer, e.g., the first quantizer 218 of FIG. 3, can be an 8-bit quantizer and the second quantizer, e.g., the second quantizer 220 of FIG. 3, can be a 1-bit quantizer, such as a class I) ADC. Simulations have shown that the in-band performance of such a configuration having a second order and operated at an OSR of 128$x$ can match the in-band performance of a conventional 8-bit delta-sigma ADC. Such a configuration can include a 1-bit feedback digital-to-analog converter circuit, as compared to 8-bit feedback digital-to-analog converter circuit that a conventional delta-sigma ADC would require.

In some examples, the filter F(z) of FIG. 3 can be a second order filter, such as $2z^{-1}-(z^{-2})$. A second order filter can provide second order shaping of the second quantizer, e.g., the second quantizer 220 of FIG. 3. By using a second order filter in the second quantizer loop, the requirement of the OSR for MQL can be reduced, such as from 64× to 32× as mentioned above in order to match the performance of the conventional delta-sigma ADC.

The filter F(z) of FIG. 3 can be higher than second order. In some examples, the filter F(z) of FIG. 3 and the excess loop delay compensation circuit 228 of FIG. 3, for example, can be implemented using digital techniques. By using digital techniques, the order of the filter and/or the coefficient of the gain block 232, for example, can be easily changed to suit customer requirements, for example.

Figure 6:
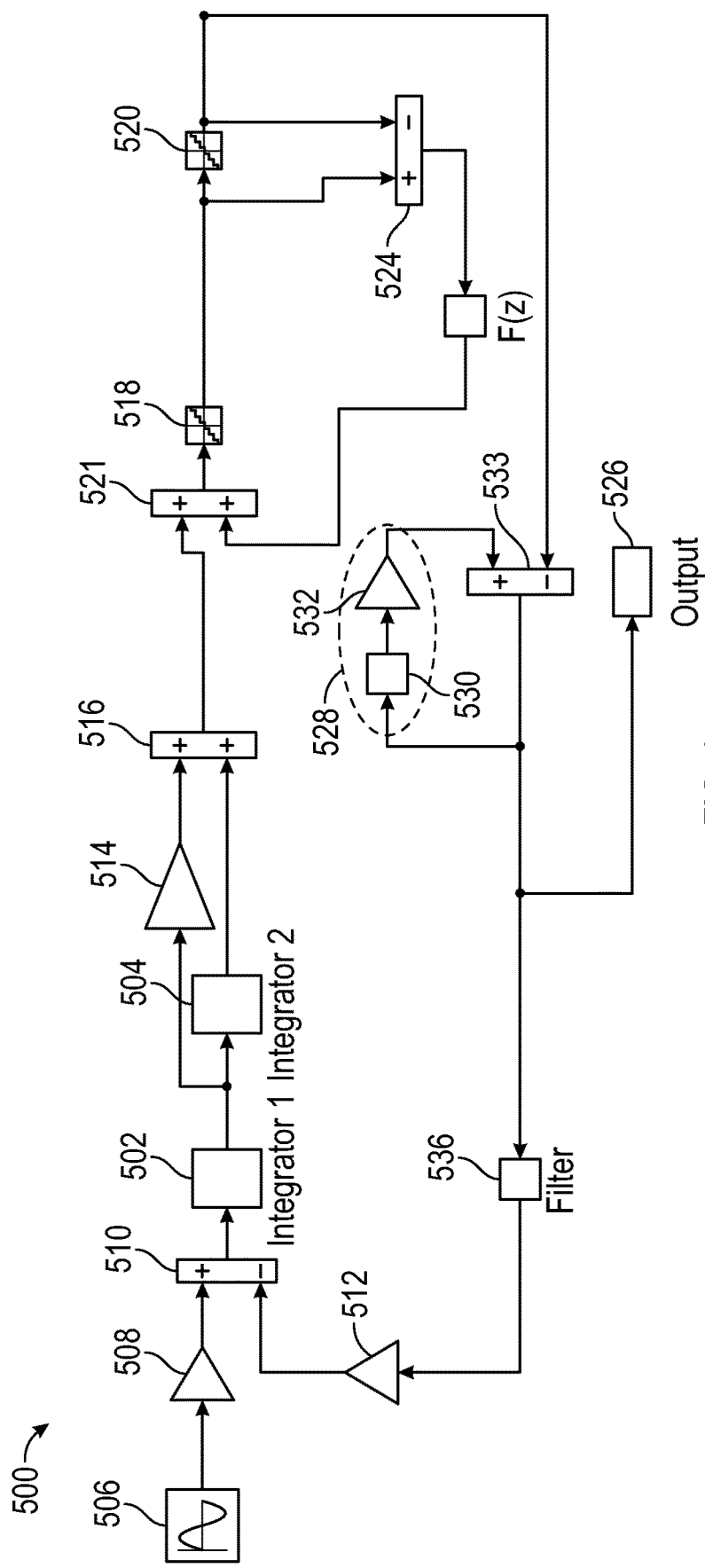
FIG. 6 is a block diagram of another example of a delta-sigma ADC circuit that can implement various techniques of this disclosure.

Referring to FIG. 3, the output of the filter F(z) can be coupled to the input of the second quantizer 220. However, in other examples, such as shown in FIG. 6, the output of the filter F(z) can be coupled to the input of the first quantizer 218. In addition, the excess loop delay compensation circuit 228 in FIG. 3 can be coupled to the input of the second quantizer 220. However, in other examples, such as shown in FIG. 6, the output of the excess loop delay compensation circuit can be combined with the output of the second quantizer and applied to the filter coupled to the input of the feedback digital-to-analog converter circuit.

FIG. 6 is a block diagram of another example of a delta-sigma ABC circuit that can implement various techniques of this disclosure. In the example shown, the circuit 500 can be a second order feed-forward loop having a first integrator 502 and a second integrator 504. The first integrator 502 and the second integrator 504 can be continuous time integrators or discrete time integrators, e.g., switched capacitor-based integrators. The circuit 500 can receive an analog input signal 506 at an input 508, e.g., a buffer. An input summing node 510 can receive and combine the analog input signal 506 and an output of a feedback digital-to-analog converter circuit 512.

The first integrator 502 can receive the output of the input summing node 510 and perform an integration. The output of the first integrator 502 can be applied to a gain block 514, and the output of the gain block 514 can be combined with the output of the second integrator 504 by a summing node 516. The first integrator 502 and the second integrator 504 form a second order loop filter. In other examples, there can be one integrator or more than two integrators. As such, the loop filter can be any order loop filter.

As mentioned above, the circuit 500 can include a first quantizer 518 and a second quantizer 520. The first quantizer 518 can be coupled to an output of a summing node 521. The summing node 521 can receive the output of the summing node 516 and combine it with the output of a filter F(z), where the output of the summing node 516 can be a representation of the combined analog input signal 506 and output of the digital-to-analog converter circuit 512. As such, the first quantizer 518 can receive a representation of the combined analog input signal and output of the digital-to-analog converter circuit. In addition, and in contrast to FIG. 3, an output of the filter F(z) can be applied to an input of the first quantizer 518 in FIG. 6. The first quantizer 518 can generate an output having a first number of bits. As a non-limiting example, the first quantizer 518 can generate an output having 8-10 bits.

The first quantizer 518 can dictate the in-band signal-to-quantization noise ratio (SQNR) of the circuit 500. In some examples, the first quantizer 518 can be a flash ADC. In some examples, the first quantizer 518 can be a successive approximation register (SAR) ADC circuit, such as an asynchronous SAR ADC or a synchronous SAR ABC.

In accordance with this disclosure, the circuit 500 can further include a second quantizer 520 coupled to an output of the first quantizer 518 to receive the output of the first quantizer 518. The second quantizer 520 can generate an output having a second number of bits. In some examples, the second number of bits is less than the first number of bits. As a non-limiting example, the second quantizer 520 can generate an output having 4 or 5 bits.

In some examples, the second number of bits of the second quantizer 520 can be less than the first number of bits of the first quantizer 518. In some examples, the second quantizer 520 can implemented using digital techniques, such as a processor circuit, such as a digital signal processor circuit.

The input of the second quantizer 520 can be applied to a summing node 524 and subtracted from the output of the second quantizer 520. An output of the summing node 524 can be applied to a filter F(z), e.g., a finite impulse response (FIR) filter, which can then be fed to the summing node 521 during the next clock cycle. The filter F(z) can be a first order filter or a higher order filter. In some examples, the filter F(z) can be a delay such as $z^{-1}$.

In some configurations in which the first quantizer 518 is a SAR ADC, an excess loop delay compensation circuit 528 can be included. The excess loop delay compensation circuit 528 can include a filter 530, e.g., a delay such as $z^{-1}$, and a gain block 532, for example. The output of the excess loop delay compensation circuit 528 can be fed to a loop delay summing node 533 coupled to receive and combine the output of the excess loop delay compensation circuit 528 and the output of the second quantizer 520, This technique of using a second quantizer 520 can re-quantize the output of the first quantizer 518 in order to reduce the number of bits applied to the feedback digital-to-analog converter circuit 512. In this manner, the circuit 500 can include a multi-quantizer loop (MQL). Although two quantizers are shown, more than two quantizers can be used. In such a configuration, the number of bits can be reduced in stages, such as from 8 bits to 5 bits to 3 bits using three quantizers.

The output of the summing node 533 can be fed to a filter 536, e.g., a delay, such as $z^{-1}$, such as in configurations in which the first quantizer 518 is a SAR ADC. In addition, the output of the summing node 533 can be applied to an output node 526 of the circuit 500 to provide a digital output of the delta-sigma ADC.

As an example, the filter 536 can provide one clock delay to emulate the delay of a SAR ADC or for dynamic element matching. The filter 536 can be coupled to an input of the feedback digital-to-analog converter circuit 512. As a non-limiting example, the feedback digital-to-analog converter circuit 512 can generate an output having 4 or 5 bits. In this manner, the feedback digital-to-analog converter circuit 512 can be coupled to the second quantizer 520 to receive a representation of the output of the second quantizer 520, where the output of the feedback digital-to-analog converter circuit 512 has the second number of bits.

In some instances, the circuit 500 of FIG. 6 can be simpler to implement than the circuit 200 of FIG. 3, For example, in some instances it can be simpler to add the output of the filter F(z) in the analog domain, such as by using the summing node 521 in FIG. 6, as compared to the configuration of FIG. 3.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective tennis "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined. With reference to the appended claims, along with the full scope of equivalents to which such claims are entitled.

The claimed invention is:

1. A delta-sigma analog-to-digital converter circuit to receive an analog input signal at an input and generate a digital output signal, the delta-sigma analog-to-digital converter circuit comprising:
an input summing node configured to receive and combine the analog input signal and an output of a digital-to-analog converter circuit;
a first quantizer to receive a representation of the combined analog input signal and output of the digital-to-analog converter circuit, the first quantizer to generate an output having a first number of bits;
a second quantizer coupled to an output of the first quantizer to receive the output of the first quantizer, the second quantizer to generate an output having a second number of bits;
the digital-to-analog converter circuit coupled to the second quantizer to receive a representation of the output of the second quantizer, wherein the output of the digital-to-analog converter circuit has the second number of bits; and
an output node coupled to the output of the second quantizer, wherein the output node is configured to provide the digital output signal, wherein the digital output signal has the second number of bits.

2. The delta-sigma analog-to-digital converter circuit of claim 1, comprising:
a filter to receive a difference between an input of the second quantizer and the output of the second quantizer.

3. The delta-sigma analog-to-digital converter circuit of claim 2, wherein an output of the filter is applied to an input of the first quantizer.

4. The delta-sigma analog-to-digital converter circuit of claim 2, wherein an output of the filter is combined with the output of the first quantizer.

5. The delta-sigma analog-to-digital converter circuit of claim 1, comprising:
an excess loop delay compensation circuit to receive an output of the second quantizer and to compensate for a delay introduced by the first quantizer.

6. The delta-sigma analog-to-digital converter circuit of claim 5, comprising:
a second quantizer summing node to receive an output of the excess loop delay compensation circuit, an output of a filter, and the output of the first quantizer.

7. The delta-sigma analog-to-digital converter circuit of claim 5, comprising:
a loop delay summing node coupled to receive and combine the output of the excess loop delay compensation circuit and the output of the second quantizer.

8. The delta-sigma analog-to-digital converter circuit of claim 1, wherein the first quantizer includes a successive approximation register (SAR) analog-to-digital converter.

9. The delta-sigma analog-to-digital converter circuit of claim 1, wherein the second number of bits is less than the first number of bits.

10. A method of operating a delta-sigma analog-to-digital converter circuit to receive an analog input signal at an input and generate a digital output signal, the method comprising:
receiving and combining, using an input summing node, the analog input signal and an output of a digital-to-analog converter circuit;
receiving, using a first quantizer, a representation of the combined analog input signal and output of the digital-to-analog converter circuit and generating an output having a first number of bits;
receiving, using a second quantizer coupled to an output of the first quantizer, the output of the first quantizer and generating an output having a second number of bits; and
receiving, using the digital-to-analog converter circuit coupled to the second quantizer, a representation of the output of the second quantizer, wherein the output of the digital-to-analog converter circuit has the second number of bits; and
generating the digital output signal, wherein the digital output signal has the second number of bits.

11. The method of claim 10, comprising:
receiving, using a filter, a difference between an input of the second quantizer and the output of the second quantizer.

12. The method of claim 11, wherein the filter has an output, the method comprising:
applying the output of the filter to an input of the first quantizer.

13. The method of claim 11, wherein the filter has an output, the method comprising:
combining an output of the filter with the output of the first quantizer.

14. The method of claim 10, comprising:
receiving, using an excess loop delay compensation circuit, an output of the second quantizer and to compensate for a delay introduced by the first quantizer.

15. The method of claim 14, comprising:
receiving, using a second quantizer summing node, an output of the excess loop delay compensation circuit, an output of a filter, and the output of the first quantizer.

16. The method of claim 14, comprising:
receiving and combining, using a loop delay summing node, the output of the excess loop delay compensation circuit and the output of the second quantizer.

17. The method of claim 10, wherein receiving, using the first quantizer, the representation of the combined analog input signal and output of the digital-to-analog converter circuit and generating the output having the first number of bits includes:
receiving, using a successive approximation register (SAR) analog-to-digital converter, the representation of the combined analog input signal and output of the digital-to-analog converter circuit and generating the output having the first number of bits.

18. The method of claim 10, wherein the second number of bits is less than the first number of bits.

19. A delta-sigma analog-to-digital converter circuit to receive an analog input signal at an input and generate a digital output signal, the delta-sigma analog-to-digital converter circuit comprising:
an input summing node configured to receive and combine the analog input signal and an output of a digital-to-analog converter circuit;
a successive approximation register analog-to-digital converter to receive a representation of the combined analog input signal and output of the digital-to-analog converter circuit, the successive approximation register analog-to-digital converter to generate an output having a first number of bits;

a digital quantizer coupled to an output of the successive approximation register analog-to-digital converter to receive the output of the successive approximation register analog-to-digital converter, the digital quantizer to generate an output having a second number of bits; and the digital-to-analog converter circuit coupled to the digital quantizer to receive a representation of the output of the digital quantizer, wherein the output of the digital-to-analog converter circuit has the second number of bits.

20. The delta-sigma analog-to-digital converter circuit of claim 19, comprising:

an excess loop delay compensation circuit to receive an output of the digital quantizer and to compensate for a delay introduced by the successive approximation register analog-to-digital converter.

* * * * *